United States Patent
Fujii et al.

(10) Patent No.: US 7,876,419 B2
(45) Date of Patent: Jan. 25, 2011

(54) EXPOSURE APPARATUS AND DEVICE MANUFACTURING METHOD

(75) Inventors: Hirofumi Fujii, Utsunomiya (JP); Hiroshi Ito, Utsunomiya (JP); Mitsuru Inoue, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 508 days.

(21) Appl. No.: 11/959,197

(22) Filed: Dec. 18, 2007

(65) Prior Publication Data

US 2008/0158530 A1 Jul. 3, 2008

(30) Foreign Application Priority Data

Dec. 28, 2006 (JP) .............................. 2006-354430

(51) Int. Cl.
G03B 27/42 (2006.01)
G03B 27/58 (2006.01)

(52) U.S. Cl. .......................................... 355/53; 355/72

(58) Field of Classification Search .................. 355/52, 355/72–76, 53; 310/10, 12
See application file for complete search history.

(56) References Cited

U.S. PATENT DOCUMENTS

| 5,121,898 A | 6/1992 | Yasuda et al. | |
|---|---|---|---|
| 6,327,024 B1 * | 12/2001 | Hayashi et al. | 355/53 |
| 6,894,449 B2 * | 5/2005 | Nishi | 318/114 |
| 7,084,956 B2 * | 8/2006 | Dams et al. | 355/53 |
| 2005/0018160 A1 | 1/2005 | Dams et al. | |
| 2007/0097340 A1 * | 5/2007 | Yuan et al. | 355/53 |

FOREIGN PATENT DOCUMENTS

| JP | 3-121328 A | 5/1991 |
| JP | 2005-294790 A | 10/2005 |
| JP | 2005-311165 A | 11/2005 |
| KR | 2002-0014639 A | 2/2002 |

* cited by examiner

*Primary Examiner*—Hung Henry Nguyen
(74) *Attorney, Agent, or Firm*—Canon U.S.A., Inc. I.P. Division

(57) ABSTRACT

An exposure apparatus including a projection optical system and configured to expose a substrate to light via the projection optical system includes a support configured to support the projection optical system, an object supported by the support and movable relative the support, an actuator configured to drive the object, a detector configured to detect a relative position between the object and the support, and a controller configured to perform a control of the actuator based on an output of the detector to cause the object to follow the support. The controller is configured to perform an estimation of a vibration of the support based on an output of the detector in parallel with the control to cause the object to follow the support.

8 Claims, 13 Drawing Sheets

EXPOSURE APPARATUS AND DEVICE MANUFACTURING METHOD

BACKGROUND OF THE INVENTION

1. Field of the Invention

The present invention relates to an exposure apparatus including a support configured to support a projection optical system and a device manufacturing method using the exposure apparatus.

2. Description of the Related Art

Conventionally, in processes for manufacturing a semiconductor device including a micropattern, such as a large scale integrated circuit (LSI) or a very large scale integrated circuit (VLSI), a pattern formed on a reticle (mask) is projected onto a substrate with a reduced projection exposure apparatus. Since the substrate is coated with a photosensitive material, the pattern is transferred to the substrate. In order to meet a demand for finer micropatterns that are required in highly-integrated semiconductor devices, resist processes have improved and exposure apparatuses have become capable of handling highly-integrated semiconductor devices.

In an exposure apparatus configured to perform micropattern exposure, transmission of a vibration from the floor on which the exposure apparatus is placed to the exposure apparatus can cause deterioration in overlay precision and precision of exposure images. Waiting the vibration to cease, however, will result in lower throughput. Further, vibration tolerance is even more critical for a next-generation exposure apparatus using extreme ultraviolet (EUV) light.

Japanese Patent Application Laid-Open No. 3-121328 discusses a technique to reduce such a vibration by measuring vibration of a vibration control base having an acceleration sensor. FIG. 12 illustrates a configuration discussed in Japanese Patent Application Laid-Open No. 3-121328.

A vibration control base 1012 is supported by an air mount 1011. Air is supplied to the air mount 1011 via a control valve 1015. An acceleration sensor 1013 is mounted on the vibration control base 1012. A controller 1014 controls an opening of the control valve 1015 according to an acceleration signal detected by the acceleration sensor 1013. As a result, the vibration of the vibration control base 1012 is controlled.

Further, Japanese Patent Application Laid-Open No. 2005-294790 discusses a configuration in which a vibration transmitted from a first part to a second part is controlled. The first part is clamped to a base arranged on a floor and the second part is clamped to a frame configured to support a projection optical system. FIG. 13 illustrates the configuration discussed in Japanese Patent Application Laid-Open No. 2005-294790.

In FIG. 13, a gas spring 73, which is arranged between a first part 69 and a second part 71, is configured to control transmission of the vibration. Further, the position of the second part 71 relative to the first part 69 is controlled by a position control system.

The position control system includes a reference object 200 supported by the first part 69 via a reference support structure 201 (reference spring), a position sensor 202 mounted on the second part 71, and an actuator 203 arranged between the first part 69 and the second part 71.

The position sensor 202 detects a distance between the reference object 200 and the position sensor 202. The actuator 203 is controlled according to a detection signal from the position sensor 202.

However, in a case where a vibration of a supporting member that supports a projection optical system is measured by an acceleration sensor as discussed in Japanese Patent Application Laid-Open No. 3-121328, it is difficult to precisely detect a low-frequency vibration below 1 Hz according to a performance characteristic of the acceleration sensor.

On the other hand, in a case where a distance between the reference object 200 supported by the first part 69 and the position sensor 202 supported by the second part 71 is measured as discussed in Japanese Patent Application Laid-Open No. 2005-294790, measurement error may increase due to different ambient environment surrounding the reference object 200 and the position sensor 202. Here, the ambient environment includes such factors as temperature, humidity, and pressure.

Further, if the position of the second part 71, which is a supporting member that supports the projection optical system, is controlled according to a measurement of the vibration using the position sensor 202 and the reference object 200, the second part 71 may oscillate according to the natural vibration frequency of the reference spring, which supports the reference object 200.

SUMMARY OF THE INVENTION

The present invention is directed to an exposure apparatus that reduces vibration with high accuracy.

According to an aspect of the present invention, an exposure apparatus including a projection optical system and configured to expose a substrate to light via the projection optical system includes a support configured to support the projection optical system, an object supported by the support and movable relative the support, an actuator configured to drive the object, a detector configured to detect a relative position between the object and the support, and a controller configured to perform a control of the actuator based on an output of the detector to cause the object to follow the support. The controller is configured to perform an estimation of a vibration of the support based on an output of the detector in parallel with the control to cause the object to follow the support.

According to another aspect of the present invention, a method for manufacturing a device includes exposing a substrate to light using the above-described exposure apparatus, developing the exposed substrate, and processing the developed substrate to manufacture the device.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

First Exemplary Embodiment

Figure 1:
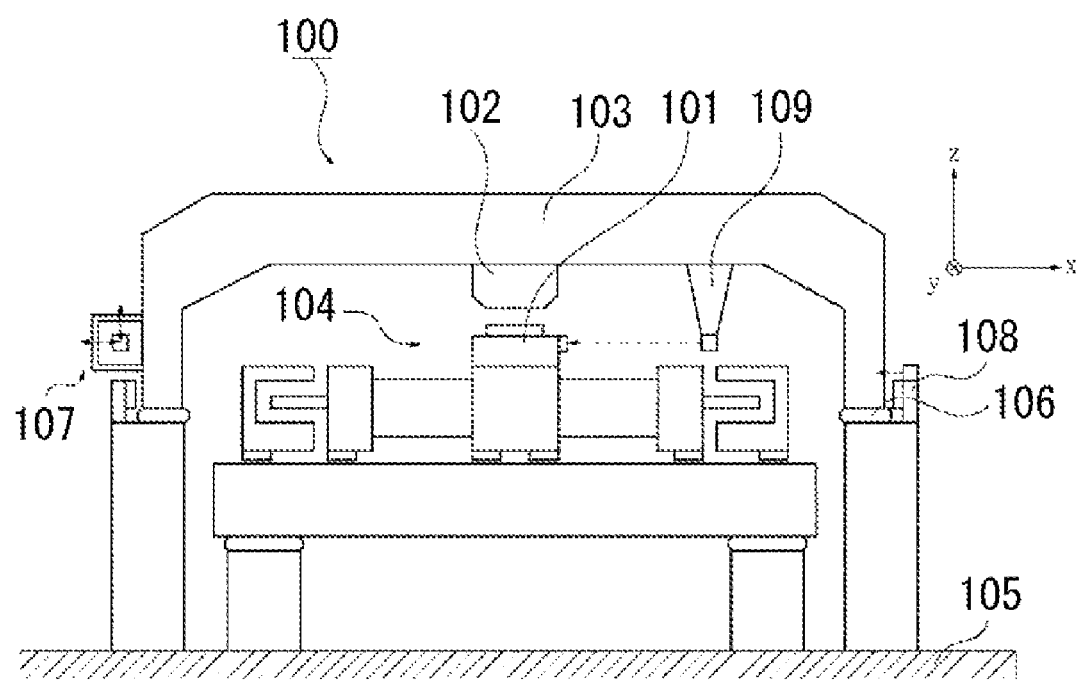
FIG. 1 illustrates an exposure apparatus according to an exemplary embodiment of the present invention.

FIG. 1 illustrates an exposure apparatus according to a first exemplary embodiment of the present invention.

An exposure apparatus 100 includes a projection optical system 102 configured to project a pattern onto a wafer 101, a supporting member 103 configured to support the projection optical system 102, and a stage apparatus 104 configured to position the wafer 101.

The supporting member 103 is mounted on a base 105 with a vibration isolation mechanism 106 inserted therebetween. The base 105 can be the floor on which the exposure apparatus 100 is placed or can also be a plate member placed on the floor.

The supporting member 103 includes a vibration estimation unit 107. The vibration estimation unit 107 is configured to estimate a vibration of the supporting member 103. The vibration of the supporting member 103 is, for example, a vibration transmitted from the base 105.

Figure 2:
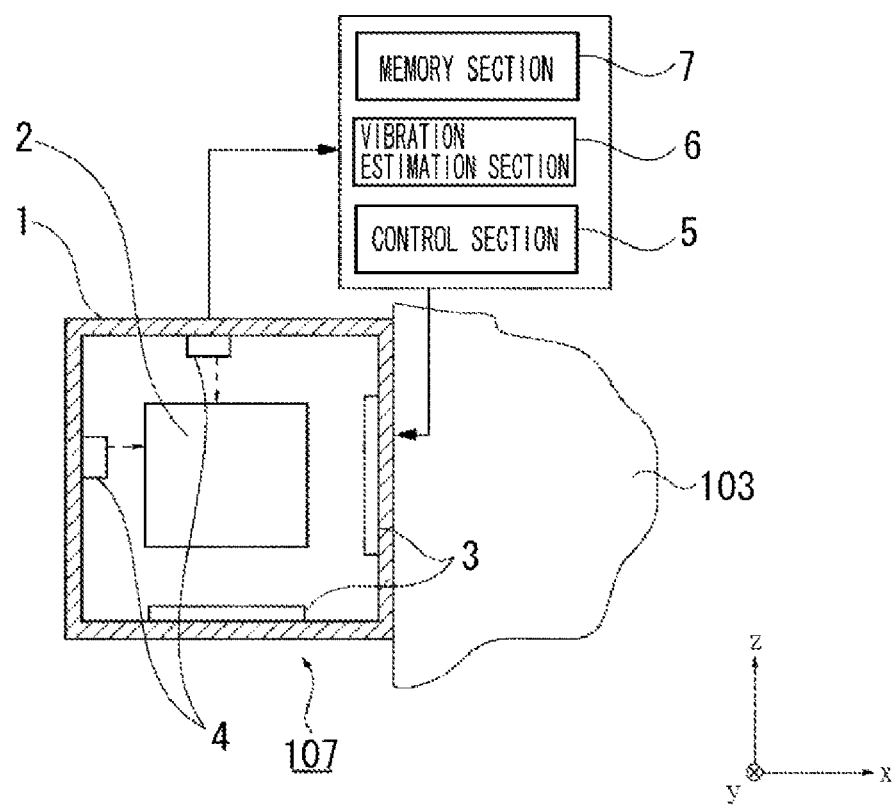
FIG. 2 illustrates a vibration estimation unit according to an exemplary embodiment of the present invention.

Details of the vibration estimation unit 107 will now be described with reference to FIG. 2. The vibration estimation unit 107 includes a member 1 that is fixed to the supporting member 103, a reference object 2 that is supported to be movable relative to the member 1, a linear motor 3 (actuator) configured to drive the reference object 2 relative to the member 1, and a sensor 4 configured to detect a relative position (relative displacement) of the reference object 2 to the member 1. The member 1 is in a form of a box.

The linear motor 3 includes a magnet and a coil. Either the magnet or the coil is fixed to the member 1 while the other is fixed to the reference object 2. The reference object 2 is supported in a levitated state by a force generated by the linear motor 3. A drive unit other than a linear motor can also be used for the linear motor 3.

The sensor 4 can be an apparatus including an optical unit, for example, a laser interferometer. The laser interferometer can be a conventional interferometer and a Michelson interferometer, which is discussed in Japanese Patent Application Laid-Open No. 60-174904, for example, can be used. According to the present exemplary embodiment, the sensor 4 detects position displacement in three axial directions, i.e., the x-, y-, and z-axis directions. Although the number of the detection directions may be one, three directions described above or further six directions including the x-, y-, and z-axis directions and their rotational directions $\omega x$, $\omega y$, and $\omega z$ can be employed. A plurality of vibration estimation units 107 configured to detect different detection directions can also be used.

It is to be noted that the member 1 can be in a form other than the box form. Further, the linear motor 3, the sensor 4, and the reference object 2 can be directly supported by the supporting member 103 without the member 1.

The vibration estimation unit 107 further includes a control section 5, a vibration estimation section 6, and a memory section 7. The control section 5 controls the linear motor 3 based on an output from the sensor 4. According to this control, the reference object 2 can follow the member 1. The control section 5 is connected to a main control section configured to control the exposure apparatus 100 or is configured integrally with the exposure apparatus 100. The control section 5 is capable of giving a command to the linear motor 3 depending on a target position of the reference object 2.

The vibration estimation section 6 estimates the vibration of the member 1 based on an output of the sensor 4 when the control section 5 causes the reference object 2 to follow the member 1 and also on a transfer function of follow-up control that is stored in advance in the memory section 7. Details of a method for estimating the vibration will be described below with reference to FIG. 3.

Figure 3:
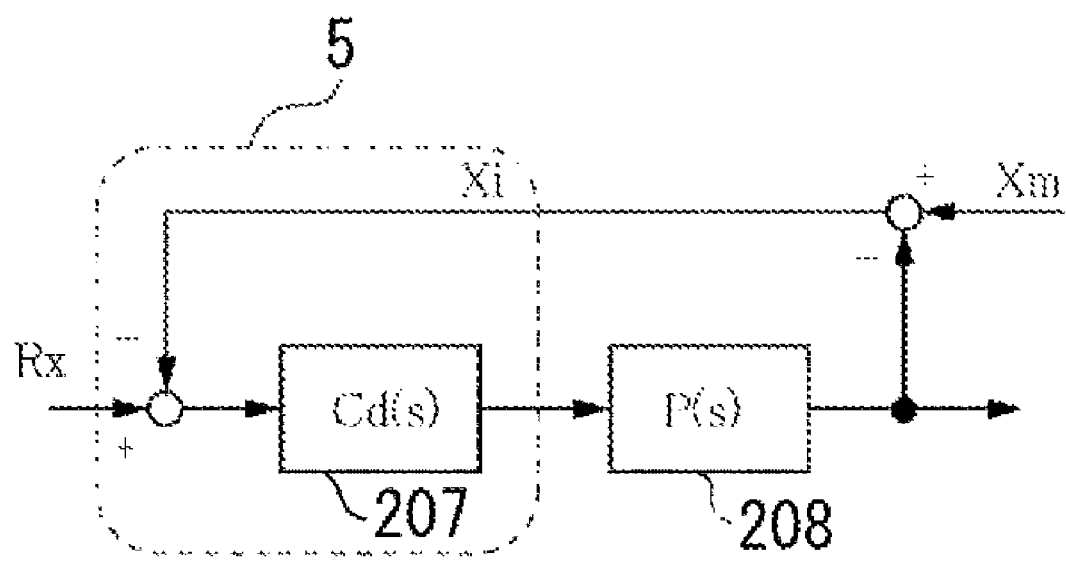
FIG. 3 is a block diagram illustrating position control for a reference object according to an exemplary embodiment of the present invention.

FIG. 3 is a block diagram illustrating position control for the reference object 2. In FIG. 3, Rx is a target position of the reference object 2, Cd(s) is a transfer function of a proportional differential (PD) compensator 207 in the control section 5, P(s) is a transfer function of the reference object 2 as a controlled object 208, and Xi is a relative position of the reference object 2 measured by the sensor 4. The measured relative position Xi is fed back to the target position Rx by the control section 5.

The measured relative position Xi contains a disturbance Xm. Since the disturbance Xm is considered to depend greatly on a vibration of the member 1 (the supporting member 103) according to the present exemplary embodiment, this disturbance Xm is estimated as a vibration.

If the transfer functions Cd(s) and P(s) are expressed by the following formula:

$$Cd(s) = Kp(1 + Kd \cdot s) \qquad (1)$$

$$P(s) = 1/ms^2 \qquad (2)$$

then, according to the block diagram illustrated in FIG. 3, the disturbance Xm is given by the following formula:

$$Xm = (Rx - Xi) \cdot Cd(s) \cdot P(s) + Xi \qquad (3)$$

Here, s represents the Laplacian operator, Kp represents a proportional gain, Kd represents a differential coefficient for proportional differential (PD) control, and m represents a mass of the reference object 2.

Since Rx, Cd(s), and P(s) are known values, these values can be stored in advance in the memory section 7. In other words, the vibration can be estimated based on the measured position Xi. Further, in order to obtain the vibration with a higher degree of accuracy, a servo band in controlling the reference object 2 to follow the member 1 and a resolution of the sensor 4 need to be considered.

An example of a servo band and a resolution will now be described. If the position of the reference object 2 is controlled at a high servo band, since follow-up of the reference object 2 to the member 1 becomes high, a deviation of the relative position between the member 1 and the reference object 2 becomes extremely small. In order to detect a small deviation, a sensor with a high resolution is necessary. However, most sensors that have a high resolution are likely to detect noise as well and, therefore, not useful.

On the other hand, if the position of the reference object 2 is controlled at a low servo band, since the reference object 2 makes a large movement between each measurement timing, the control system needs to have high linearity characteristics. Thus, the reference object 2 is controlled at a low servo band with a Lorentz-type linear motor as a drive unit. The Lorentz-type linear motor has high linearity characteristics.

Where a position control system servo band is Wc, an inverse of a differential coefficient for PD control is Wa (=1/Kd), acceleration of vibration as disturbance (second-order differential of Xm) is Ao, and a minimum resolution of a measured value (Xi) is Eo, approximately the following inequality holds true:

$$Eo < Ao/(Wc \cdot Wa) \tag{4}$$

Further, from a viewpoint of stability, where Wa=Wc/2, $$Eo < 2*Ao/Wc^2 \tag{5}$$

and $$Wc < \sqrt{2} * Ao/Eo \tag{6}$$

The inequality (6) implies that if the servo band Wc is greater than the right-hand side, since follow-up control is performed at a smaller resolution than the minimum resolution Eo of the measured value, measurement will not be made correctly.

If, for example, a vibration of the floor on which a semiconductor exposure apparatus is placed satisfies the VC-E (floor vibration allowance criterion) adopted in the Semiconductor Equipment and Materials International (SEMI) standard, since the semiconductor exposure apparatus is a precision apparatus, then Ao=0.016 [Gal]. If the resolution of the sensor is not so high, such as Eo=0.1e−6 [m] as described above, according to the aforementioned approximation, Wc<9.01 [Hz].

In other words, if a sensor with a resolution of 100 nm or less is used, then the servo band can be set at 10 Hz or lower.

Vibration of the supporting member 103 can be estimated according to the above-described method. Next, referring to FIG. 1 again, a method for controlling a vibration of the supporting member 103 using the estimation result will be described.

The exposure apparatus 100 includes a drive unit 108 configured to drive the supporting member 103 relative to the base 105. By driving the drive unit 108 based on an output of the vibration estimation unit 107, the position of the supporting member 103 can be controlled with high precision.

Figure 4:
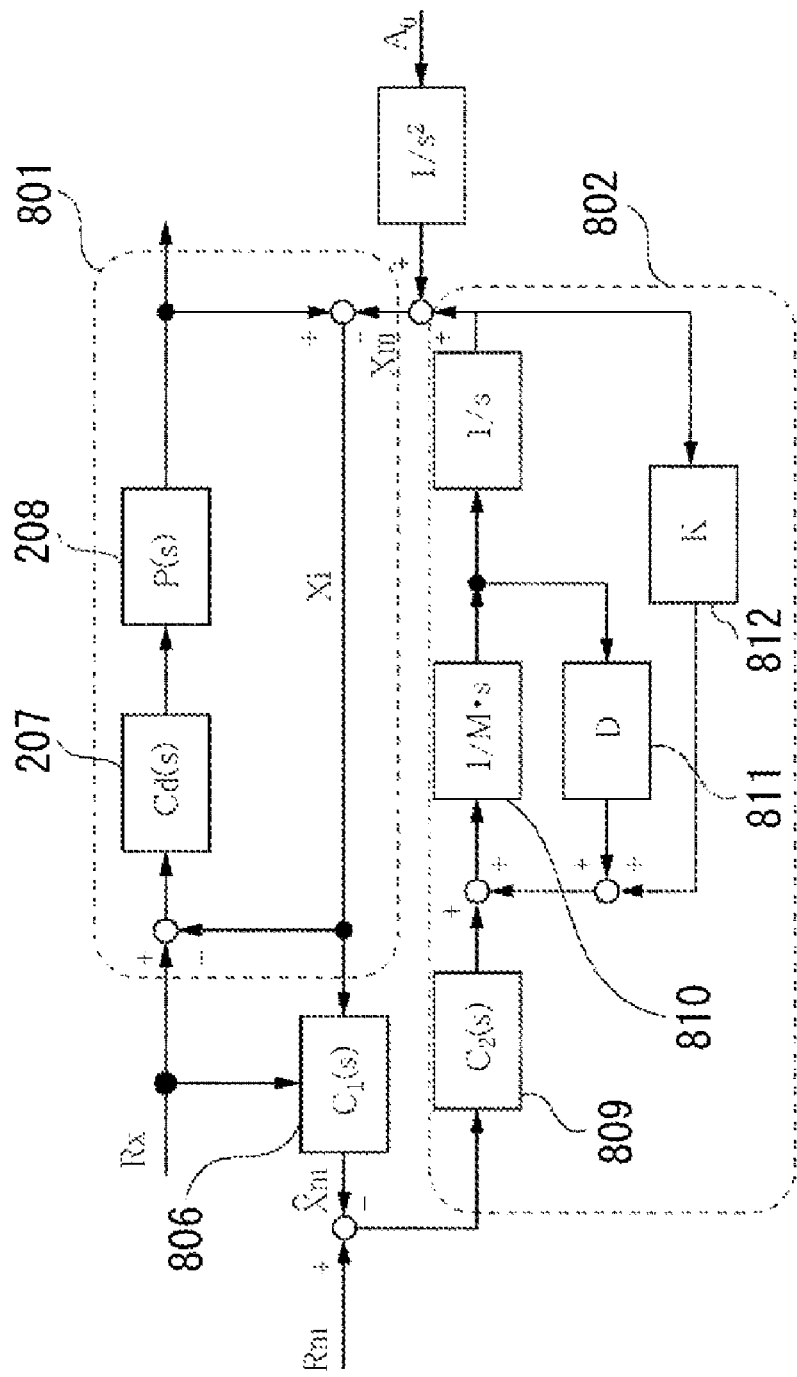
FIG. 4 is a block diagram illustrating position control for a supporting member according to an exemplary embodiment of the present invention.

Referring to FIG. 4, position control for the above-described supporting member 103 will be described. A control system 801 controls the reference object 2 as described in FIG. 3, and a control system 802 controls the supporting member 103. Since Rx, Cd(s), and P(s) are known values as described above, the vibration can be estimated by a computing unit C1(s) 806 as the vibration estimation section 6 based on the measured position Xi and the values Rx, Cd(s), and P(s). The estimated vibration will be hereinafter referred to as $\hat{X}m$.

The difference between a target position Rm of the supporting member 103 and the estimated vibration $\hat{X}m$ is input to a position compensator C2(s) 809. According to this difference, a drive force that is given by the drive unit 108 to the supporting member 103 is determined. Here, the transfer function of the supporting member 103 includes a transfer function 810 that is represented by a mass M of the supporting member 103, a transfer function 811 represented by a damping coefficient D of the supporting member 103, and a transfer function 812 represented by a spring modulus K of the supporting member 103. A position Xm of the supporting member 103 that is driven by the drive unit 108 is added as a vibration to the output of the sensor 4.

Conventionally, it is possible to control a supporting member according to positional information of the supporting member that is obtained by double integrating the acceleration information detected by an accelerometer arranged on the supporting member in a conventional manner. However, the positional information obtained by double integrating the acceleration information is not sufficiently precise.

According to the present exemplary embodiment, since a position sensor using an optical unit, such as a laser interferometer, is used, the vibration of the supporting member can be estimated based on highly precise positional information and the supporting member can be controlled accordingly.

Figure 5:
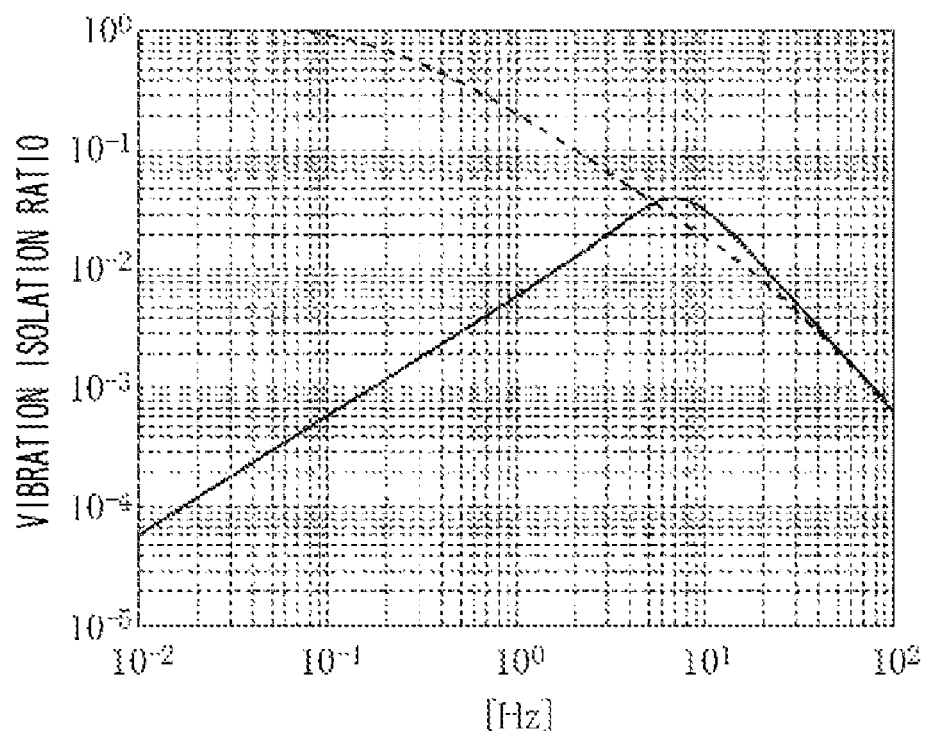
FIG. 5 illustrates vibration isolation ratios obtained when an acceleration sensor is used and when a configuration according to an exemplary embodiment of the present invention is used.

FIG. 5 illustrates vibration isolation ratios obtained when an acceleration sensor is used and when a configuration according to an exemplary embodiment of the present exemplary embodiment is used. The vertical axis represents vibration isolation ratio in FIG. 5. The horizontal axis represents frequency. Damper eigenvalue is 1 Hz. The broken line represents a case where the accelerometer is used. The acceleration of the supporting member is detected, single-integrated, and fed back by velocity. The solid line represents a case where a configuration according to the present exemplary embodiment is used. Feedback by position is performed. As can be seen from the graph illustrated in FIG. 5, a characteristic at a low-frequency range in the case of the present exemplary embodiment is improved.

According to the present exemplary embodiment, the reference object 2 is supported by the supporting member 103 via the linear motor 3 and the member 1. The linear motor 3 is capable of reducing measurement error when measuring a relative displacement between the reference object 2 and the member 1 since the reference object 2 and the member 1 are supported by the supporting member 103, which supports the projection optical system 102. This is because the supporting member 103, which supports the projection optical system 102, is heat-regulated at high precision so as to minimize deformation due to thermal expansion.

Second Exemplary Embodiment

A second exemplary embodiment of the present invention controls velocity of the reference object 2. For configurations that are not specially referred to will be regarded similar to those of the first exemplary embodiment.

Figure 6:
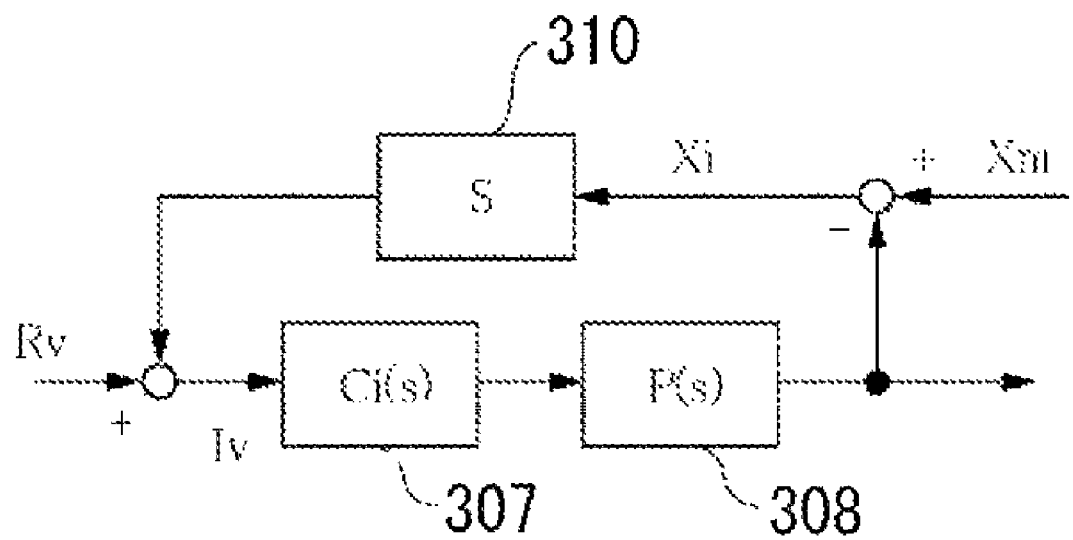
FIG. 6 is a block diagram illustrating velocity control for a reference object according to an exemplary embodiment of the present invention.

FIG. 6 is a block diagram illustrating velocity control for the reference object 2. In FIG. 6, Rv is a target velocity (e.g., zero) of the reference object 2, Ci(s) 307 is a transfer function of a proportional differential compensator 307 in the control section 5, P(s) 308 is a transfer function of the reference object 2 as a controlled object, and Xi is a relative position of the reference object 2 measured by the sensor 4. The position of the measured position Xi is converted by a first-order differentiator 310 into velocity and fed back to the target velocity Rv by the control section 5.

The measured position Xi contains a disturbance Xm. Since the disturbance Xm is considered to depend greatly on a vibration of the member 1 (the supporting member 103) according to the present exemplary embodiment, this disturbance Xm is estimated to be a vibration.

Where the transfer functions Ci(s) and P(s) are expressed in the following formula:

$$Ci(s)=Kp(1+Ki/s) \quad (7)$$

$$P(s)=1/ms^2 \quad (8)$$

then, according to the block diagram illustrated in FIG. 6, the vibration Xm is given by the following formula:

$$Xm=(Rv-Xi\cdot s)\cdot Ci(s)\cdot P(s) \quad (9)$$

Here, s represents the Laplacian operator, Kp represents a proportional gain, Ki represents a differential coefficient for proportional integral (PI) control, and m represents a mass of the reference object 2.

Since Rv, Ci(s), and P(s) are known values, these values can be stored in advance in the memory section 7. In other words, the vibration Xm can be estimated based on the measured position Xi even when the velocity of the reference object 2 is controlled.

The servo band in controlling the velocity of the reference object 2 and the resolution of the sensor 4 are similar to those in the first exemplary embodiment. In other words, the velocity of the reference object 2 is controlled at a low servo band with the linear motor 3 having high linearity, e.g., a Lorentz force linear motor. A brief description of the velocity control will now be given.

Where velocity control system servo band is Wc1, an inverse of a differential coefficient for PI control is Wa2 (=Ki), acceleration of vibration as disturbance (second-order differential of Xm) is Ao, and a minimum resolution of a measured value (Xi) is Eo, approximately the following inequality holds true:

$$Eo < Ao/(Wc2\cdot Wa2) \quad (10)$$

Further, from a viewpoint of stability, where Wa2=Wc2/2, $$Eo < 2*Ao/Wc2^2 \quad (11)$$

and $$Wc2 < \sqrt{2}*Ao/Eo \quad (12)$$

If, for example, a vibration of the floor on which a semiconductor exposure apparatus is placed satisfies the VC-E (floor vibration allowance criterion) adopted in the Semiconductor Equipment and Materials International (SEMI) standard, since the semiconductor exposure apparatus is a precision apparatus, then Ao=0.016 [Gal]. If the resolution of the sensor is not so high, such as Eo=0.1e-6 [m] as described above, according to the aforementioned approximation, Wc<9.01 [Hz].

In other words, if a sensor with a resolution of 100 nm or less is used, then the servo band can be set at 10 Hz or lower.

Since the relative velocity between the reference object 2 and the member 1 is controlled in the present exemplary embodiment, the positions of the reference object 2 and the member 1 may be displaced from the default positions. Thus, if the position of the reference object 2 exceeds a certain threshold value, it is useful that the position of the reference object 2 is reset to the default position. This can be performed during, for example, wafer exchanging. If the position of the reference object 2 is changed during exposure, it may affect exposure precision.

The displacement from the default position tends to be larger when the supporting member is moved upward or downward by the air spring (air mount). This is because the supporting member makes a big movement at a low speed by the air spring.

Further, even if determination is not made whether the position of the reference object exceeds a certain threshold value, a calibration sequence can be made to return the position of the reference object to the default position at regular intervals. For example, the calibration can be made at the time the supporting member moves upward by the above-described air spring.

Third Exemplary Embodiment

A third exemplary embodiment of the present invention has a spring element and a damping element arranged between the member 1 and the reference object 2.

Figure 7:
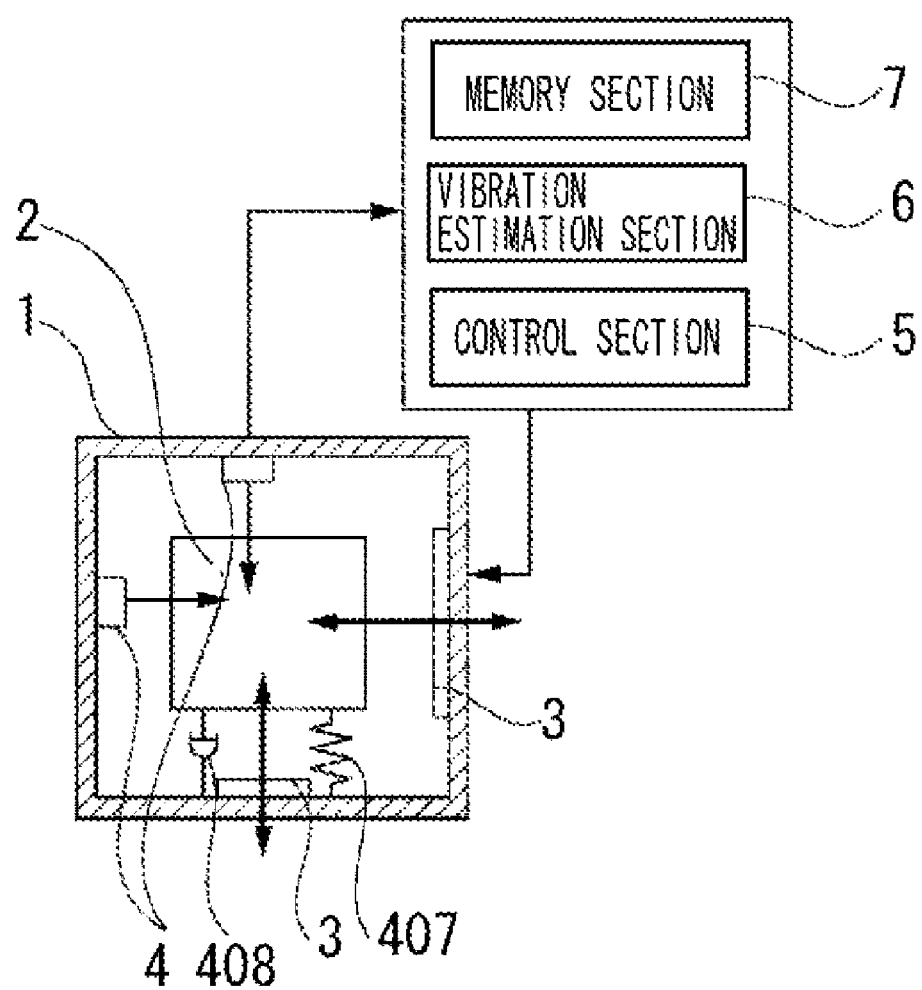
FIG. 7 illustrates a spring element and a damping element arranged between a reference object and a member according to an exemplary embodiment of the present invention.

FIG. 7 illustrates a vibration estimation unit according to the third exemplary embodiment. For configurations that are not specially referred to can be regarded similar to those of the first exemplary embodiment.

In FIG. 7, the reference object 2 is supported by the member 1 with a spring element 407 and a damping element 408 inserted therebetween. The spring element 407 supported by the member 1 and supporting the reference object 2 can be, for example, a leaf spring. An oleo damper or an air damper can be used for the damping element 408.

Figure 8:
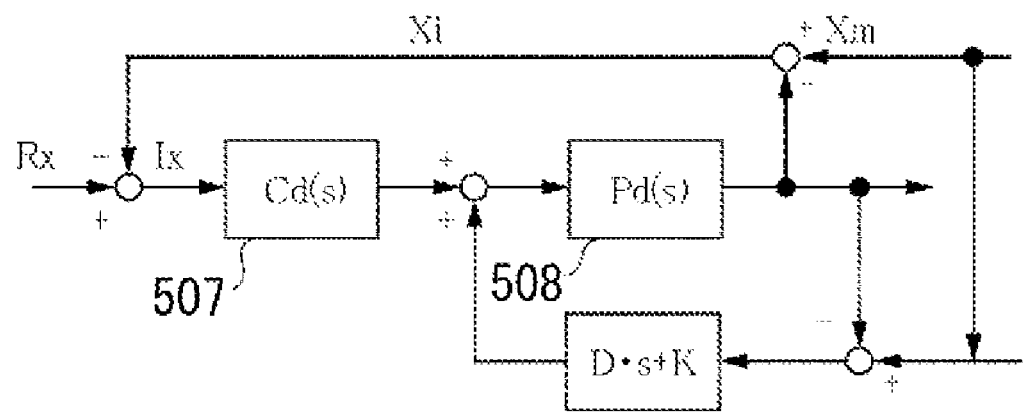
FIG. 8 is a block diagram illustrating position control for a reference object in a case where a spring element and a damping element are arranged between the reference object and a member according to an exemplary embodiment of the present invention.

FIG. 8 is a block diagram illustrating position control for the reference object 2 with the above configuration. In FIG. 8, Rx is a target position of the reference object 2, Cd(s) 507 is a transfer function of a proportional differential (PD) compensator 207 in the control section 5, Pd(s) 508 is a transfer function of the reference object 2, and Xi is a position of the reference object 2 measured by the sensor 4. The position of the measured position Xi is fed back to the target position Rx by the control section 5.

Where the transfer functions Cd(s) and Pd(s) are expressed in the following formula:

$$Cd(s)=Kp(1+Kd\cdot s) \quad (13)$$

$$Pd(s)=1/ms^2 \quad (14)$$

then, according to the block diagram illustrated in FIG. 8, the vibration Xm is given by the following formula:

$$Xm=Xi+\{(Rx-Xi)\cdot Cd(s)+Xi\cdot(D\cdot s+K)\}\cdot Pd(s) \quad (15)$$

Here, s represents the Laplacian operator, Kp represents a proportional gain, Kd represents a differential coefficient for proportional differential (PD) control, m represents a mass of the reference object 2, K represents a spring modulus of the spring element 407, and D represents a damping coefficient of the damping element 408.

Since Rx, Cd(s), and Pd(s) are known values, these values can be stored in advance in the memory section 7. In other words, the vibration Xm can be estimated based on the measured position Xi.

Fourth Exemplary Embodiment

A fourth exemplary embodiment of the present invention controls a velocity of the reference object 2 with a configuration of the third exemplary embodiment. For configurations that are not specially referred to shall be regarded similar to those of the third exemplary embodiment.

Figure 9:
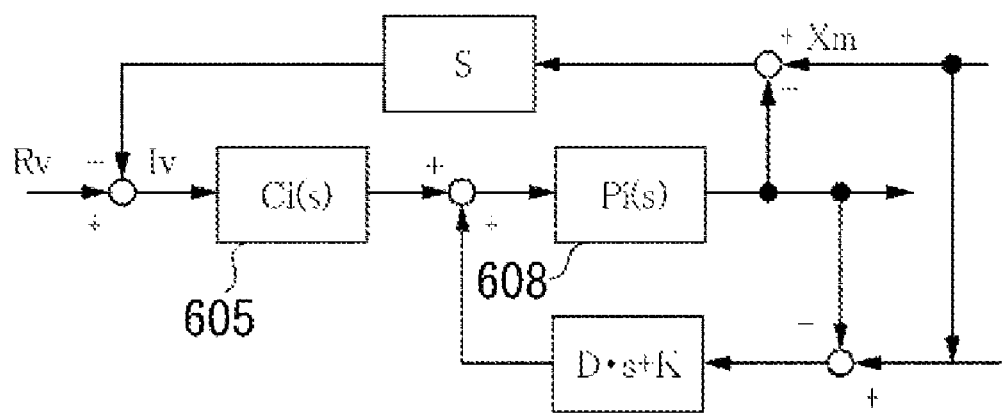
FIG. 9 is a block diagram illustrating velocity control for a reference object in a case where a spring element and a damping element are arranged between the reference object and a member according to an exemplary embodiment of the present invention.

FIG. 9 is a block diagram illustrating velocity control for the reference object 2 using a vibration estimation unit 5 including a spring element and a damping element.

In FIG. 9, Rv is a target velocity of the reference object 2, Ci(s) 605 is a transfer function of a proportional integral (PI) compensator in the control section 5, Pi(s) 608 is a transfer function of the reference object 2, and Xi is a position of the reference object 2 measured by the sensor 4. The position of the measured position Xi is fed back to the target velocity Rv by the control section 5.

The measured position Xi contains a disturbance Xm. Since the disturbance Xm is considered to depend greatly on a vibration of the member 1 (the supporting member 103) according to the present exemplary embodiment, this disturbance Xm is estimated to be a vibration.

Where the transfer functions Ci(s) and Pi(s) are expressed in the following formula:

$$Ci(s)=Kp(1+Ki/s) \quad (16)$$

$$Pi(s)=1/ms^2 \quad (17)$$

then, according to the block diagram illustrated in FIG. 9, the vibration Xm is given by the following formula:

$$Xm=Xi \cdot s \cdot (Rv-Xi \cdot s) \cdot Ci(s)+Xi \cdot s \cdot (D \cdot s+K)\} Pi(s) \quad (18)$$

Here, s represents the Laplacian operator, Kp represents a proportional gain, Ki represents a differential coefficient for PI control, and m represents a mass of the reference object 2, K represents a spring modulus of the spring element 407, and D represents a damping coefficient of the damping element 408.

Since Rv, Ci(s), and Pi(s) are known values, these values can be stored in advance in the memory section 7. In other words, the vibration Xm can be estimated based on the measured position Xi even when the velocity of the reference object 2 is controlled.

As described above, when the reference object 2 is connected via the spring element 407 or the damping element 408, power used for driving the linear motor 3 can be reduced.

Figure 10:
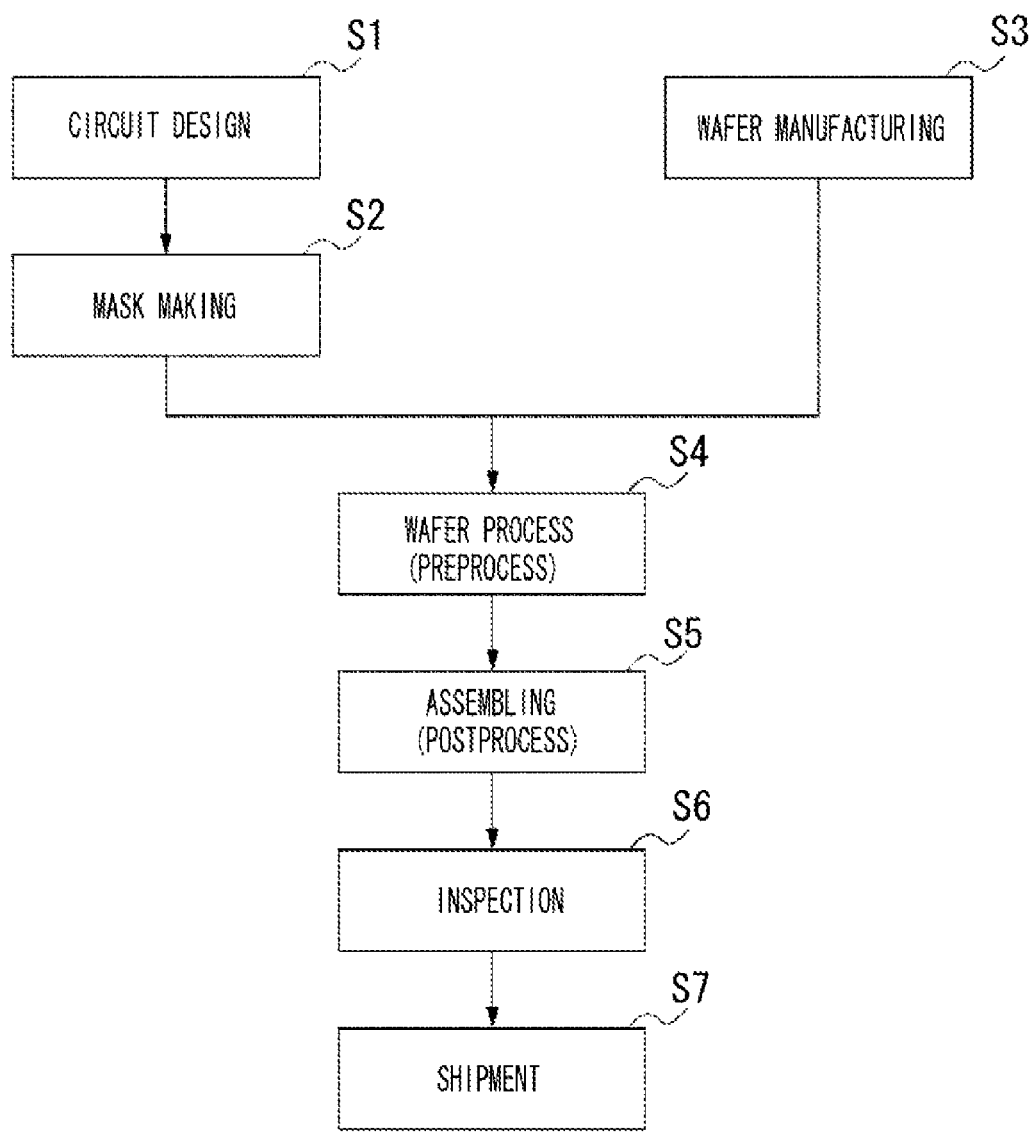
FIG. 10 is a flowchart illustrating device manufacturing processes according to an exemplary embodiment of the present invention.

Device manufacturing processes using the above-described exposure apparatus will now be described with reference to FIGS. 10 and 11. FIG. 10 is a flowchart illustrating exemplary processes for manufacturing a semiconductor device (e.g., an integrated circuit (IC), an LSI, a liquid crystal display (LCD), and a charge-coupled device (CCD)) using the above-described exposure apparatus. In the present exemplary embodiment, a method for manufacturing a semiconductor chip will be described as an example.

Step S1 is a circuit design process for designing a circuit of a semiconductor device. Step S2 is a mask making process for fabricating a mask based on a designed circuit pattern. Step S3 is a wafer manufacturing process for manufacturing a wafer from a silicon or comparable material. Step S4 is a wafer process, which can be referred to as "preprocess", for forming an actual circuit on a wafer using the aforementioned exposure apparatus with the above-described prepared mask according to the lithography technique.

Step S5 is an assembling process, which can be referred to as "postprocess", for forming a semiconductor chip using the wafer manufactured in step S4. The postprocess includes an assembly process (e.g., dicing, bonding, etc.) and a packaging process (chip sealing). Step S6 is an inspection process for inspecting the semiconductor device manufactured in step S5. The inspection includes an operation confirmation test and an endurance test. Step S7 is a shipment process for shipping the semiconductor device completed through the above-described processes.

Figure 11:
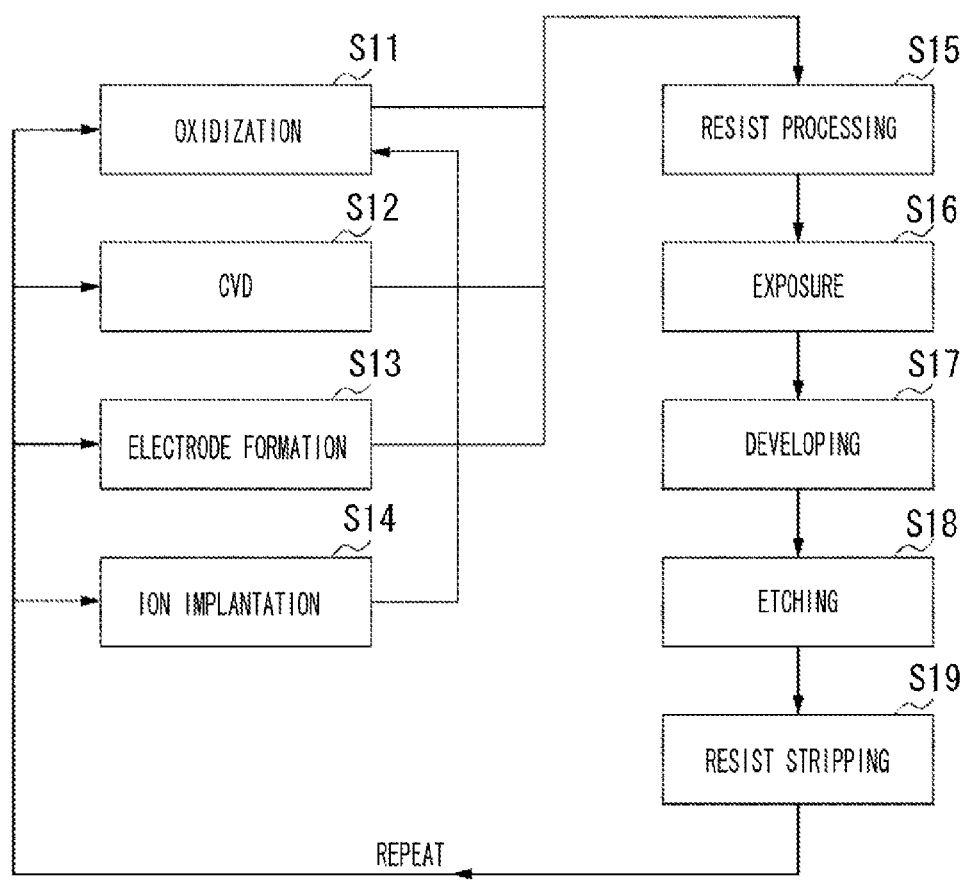
FIG. 11 is a detailed flowchart illustrating a wafer process illustrated in FIG. 10.
Figure 12:
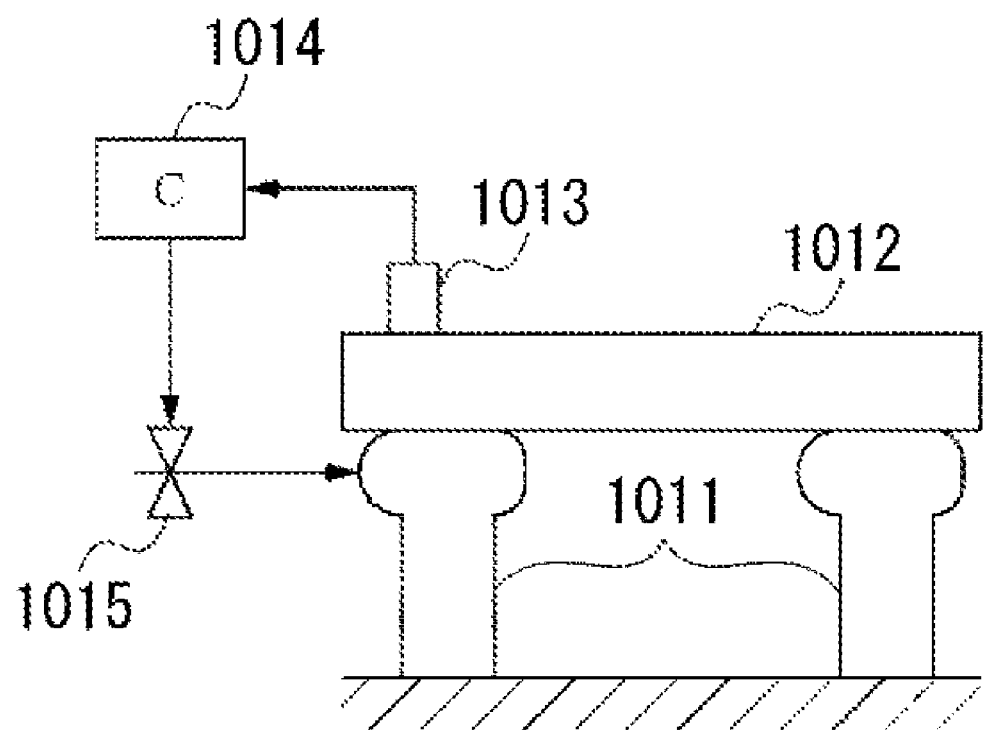
FIG. 12 illustrates a conventional vibration control technique using an accelerometer.
Figure 13:
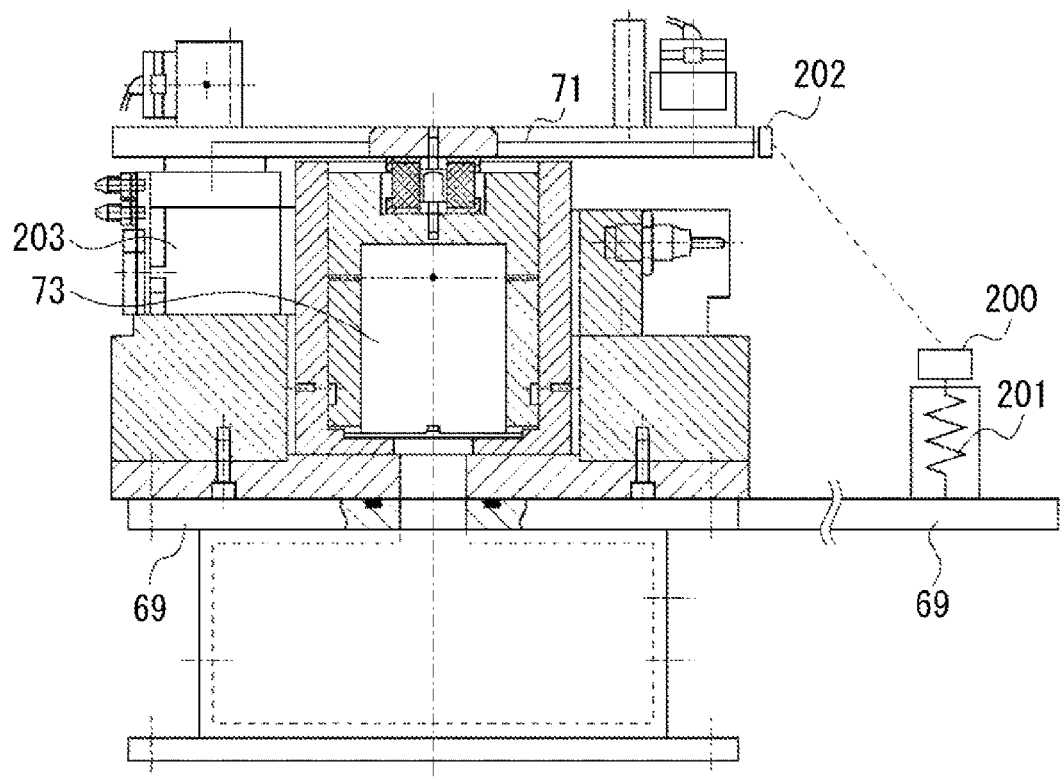
FIG. 13 illustrates a configuration of a conventional position measuring apparatus.

As illustrated in FIG. 11, the above-described wafer process in step S4 includes an oxidation step S11 for oxidizing a wafer surface, a chemical vapor deposition (CVD) step S12 for forming an insulating film on the wafer surface, and an electrode formation step S13 for forming electrodes on the wafer by vaporization. Furthermore, the wafer process in step S4 includes an ion implantation step S14 for implanting ions into the wafer, and a resist processing step S15 for coating the wafer with a photosensitive material.

Furthermore, the wafer process in step S4 includes an exposure step S16 for exposing the wafer subjected to the resist processing step to light using the above-described exposure apparatus with a mask having a circuit pattern, a developing step S17 for developing the wafer exposed in the exposure step S16, an etching step S18 for cutting a portion other than a resist image developed in the developing step S17, and a resist stripping step S19 for removing an unnecessary resist remaining after the etching step S18. The processing repeating the above-described steps can form multiple circuit patterns on a wafer.

According to the above-described exemplary embodiments, an exposure apparatus that is capable of reducing vibration with a high degree of accuracy can be realized.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2006-354430 filed Dec. 28, 2006, which is hereby incorporated by reference herein in its entirety.

What is claimed is:

1. An exposure apparatus including a projection optical system and configured to expose a substrate to light via the projection optical system, the exposure apparatus comprising:
  a base;
  a support mounted on the base and configured to support the projection optical system;
  a vibration isolation mechanism inserted between the base and the support;
  an object supported by the support and movable relative to the support;
  an actuator supported by the support and configured to generate a force applied to the object;
  a detector supported by the support and configured to detect a relative position between the object and the support; and
  a controller configured to perform a control of the actuator based on an output of the detector to cause the object to follow the support,
  wherein the controller is configured to perform an estimation of a vibration of the support based on an output of the detector in parallel with the control to cause the object to follow the support.

2. An exposure apparatus according to claim 1, wherein the controller is configured to estimate the vibration of the support further based on a transfer function of an element associated with the control to cause the object to follow the support and a target value associated with the control to cause the object to follow the support.

3. An exposure apparatus according to claim 1, wherein the actuator includes a linear motor, and the object is supported by the support via the linear motor.

4. An exposure apparatus according to claim 1, further comprising at least one of a spring element and a damping element between the support and the object.

5. An exposure apparatus according to claim 1, wherein the controller is configured to control a velocity of the object to cause the object to follow the support.

6. An exposure apparatus according to claim 5, wherein the controller is configured to determine whether an output of the detector exceeds a threshold and to cause the actuator to reset a position of the object based on the determination.

7. An exposure apparatus according to claim 1, further comprising:
   a second actuator configured to generate a force applied to the support, and
   a second controller configured to control the second actuator based on the estimated vibration of the support.

8. A method of manufacturing a device utilizing an exposure apparatus including a projection optical system and configured to expose a substrate to light via the projection optical system, the exposure apparatus including,
   a base;
   a support mounted on the base and configured to support the projection optical system;
   a vibration isolation mechanism inserted between the base and the support;
   an object supported by the support and movable relative to the support;
   an actuator supported by the support and configured to generate a force applied to the object;
   a detector supported by the support and configured to detect a relative position between the object and the support; and
   a controller configured to perform a control of the actuator based on an output of the detector to cause the object to follow the support, p1 wherein the controller is configured to perform an estimation of a vibration of the support based on an output of the detector in parallel with the control to cause the object to follow the support,
the method comprising:
   exposing a substrate to light using the exposure apparatus;
   developing the exposed substrate; and
   processing the developed substrate to manufacture the device.

* * * * *